United States Patent
Tang

(10) Patent No.: US 9,905,804 B2
(45) Date of Patent: Feb. 27, 2018

(54) FLEXIBLE DISPLAY AND METHOD OF FORMING THE SAME

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/272,831

(22) Filed: Sep. 22, 2016

(65) Prior Publication Data
US 2018/0006271 A1    Jan. 4, 2018

(30) Foreign Application Priority Data
Jul. 1, 2016    (CN) .......................... 2016 1 05128316

(51) Int. Cl.
*H01L 35/24* (2006.01)
*H01L 51/52* (2006.01)
*H01L 51/56* (2006.01)

(52) U.S. Cl.
CPC .......... *H01L 51/5256* (2013.01); *H01L 51/56* (2013.01); *H01L 2251/5338* (2013.01)

(58) Field of Classification Search
None
See application file for complete search history.

(56) References Cited

U.S. PATENT DOCUMENTS

2017/0075492 A1*    3/2017    Kim ...................... G06F 3/0418

\* cited by examiner

*Primary Examiner* — Jack Chen
(74) *Attorney, Agent, or Firm* — Andrew C. Cheng

(57) ABSTRACT

The present disclosure proposes a flexible display and a method of forming the flexible display. The flexible display includes a flexible base, an OLED element disposing on the flexible base, an encapsulation layer disposed on the OLED element, with the flexible base and/or the encapsulation layer comprising one or more patterned inorganic layers and two or more organic layers, which are configured to wrap the inorganic layers. Therefore, when the stress focuses on the inorganic layer and leads to fractures and peeling-offs, the organic layers that wrapped the inorganic layer prevent the expansion of the fractures and peeling-offs, therefore extend the life of the flexible display being flexible and pliable.

4 Claims, 3 Drawing Sheets

FLEXIBLE DISPLAY AND METHOD OF FORMING THE SAME

BACKGROUND

1. Field of the Invention

The present disclosure relates to display technology, and especially to a flexible display and method of forming the same.

2. Description of the Related Art

Organic light-emitting diode (OLED) display equipped with thin-film transistor (TFT) can be applied to displays of mobile device, such as smart phones, digital cameras, mobile video-recorders, mobile information terminals, ultra-thin laptops or tablet personal computers, and to displays of electronic device such as ultra-thin TV. OLED display has a wide viewing angle, high contrast ratio and rapid responsiveness. Studies on how to produce thinner display device have been conducted recently, and found that flexible display is easily portable and could be applied to device of a variety of shapes. Therefore, it attracts more attention as it is considered the next-generation display device. More specifically, flexible display with OLED has been considered as a display solution. A flexible display with OLED usually includes a thin-film encapsulation layer that covers the OLED element and a flexible base layer that supports the light-emitting part. An inorganic layer is added in between the thin-film encapsulation layer and flexible base layer.

Therefore, the thin-film encapsuation layer and flexible base layer can prevent the entry of vapor and oxygen to a satisfactory degree. However, adding the inorganic layer makes the display device thicker and the stress larger, leading to stratification. In addition, when the flexible display bends, the stress focuses on the interface between the organic layer and inorganic layer, leading to fractures and peeling-offs, and therefore affects the life of the flexible display device.

SUMMARY

One object of the present disclosure is to provide a flexible display and a method of forming the same that can extend the life of the flexible display.

According to the present disclosure, a flexible display includes a flexible base, an organic light-emitting diode (OLED) element disposing on the flexible base, an encapsulation layer disposed on the OLED element, with the flexible base and/or the encapsulation layer comprising one or more patterned inorganic layers and two or more organic layers, which are configured to wrap the inorganic layers.

Furthermore, the flexible base and/or the encapsulation layer includes a plurality of patterned inorganic layers.

Furthermore, the inorganic layers include a plurality of patterned areas, with gaps formed between the plurality of patterned areas. The two or more organic layers are disposed above and below the patterned inorganic layers, and are connected through the gaps.

Furthermore, positions of gaps in the inorganic layers are not aligned with that in neighboring inorganic layers.

Furthermore, the organic layers are made of polyethylene terephthalate (PET), polymide (PI), polycarbonate (PC), epoxy, polyethylene, and/or polyacrylate, formed in single or stacked layers.

Furthermore, the inorganic layers are made of silica, silicon nitride, silicon oxynitride, aluminum oxide, aluminum nitride, or titanium oxide.

According to the present disclosure, a method of forming a flexible display includes: providing a flexible base; disposing an OLED element on the flexible display; and disposing an encapsulation layer on the OLED element. The flexible base and/or the encapsulation layer includes one or more patterned inorganic layers and two or more organic layers, which are configured to wrap the inorganic layers.

Furthermore, the method further includes: providing a supporting base; forming an organic layer on the supporting base and/or the OLED element; producing inorganic layers on the organic layer, and patterning the inorganic layers, so that the inorganic layers comprise a plurality of patterned areas and form patterned inorganic layers, with gaps formed among the plurality of patterned areas; forming an organic layer on the inorganic layers so that the two organic layers are disposed above and below the patterned inorganic layers respectively, and connected through the gaps; and repeating the forming procedure of the patterned inorganic layers and organic layers when necessary.

Furthermore, the flexible base and/or the encapsulation layer includes a plurality of patterned inorganic layers.

Furthermore, positions of gaps in the inorganic layers are not aligned with that in neighboring inorganic layers.

Different from the current technology, the present disclosure provides a flexible display and a method of forming the same. The flexible display includes a flexible base, an OLED element and an encapsulation layer. The OLED element is disposed on the flexible base, and the encapsulation layer is disposed on the OLED element. The flexible base and/or the encapsulation layer include one or more patterned inorganic layers and two or more organic layers, which are used to wrap the inorganic layer. Therefore, when the stress focuses on the inorganic layer and leads to fractures and peeling-offs, the organic layers that wrapped the inorganic layer prevent the expansion of the fractures and peeling-offs, therefore extend the life of the flexible display being flexible and pliable.

DETAILED DESCRIPTION OF PREFERRED EMBODIMENTS

Figure 1:
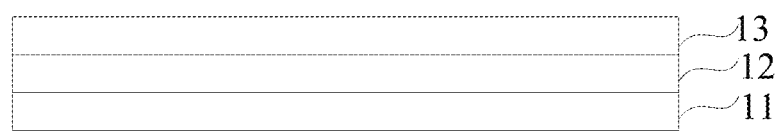
FIG. 1 is a schematic diagram of a flexible display of an embodiment of the present disclosure.

Please refer to FIG. 1. FIG. 1 is a structural diagram of a flexible display of an embodiment of the present disclosure. The flexible display 10 of the present embodiment includes a flexible base 11, an OLED element 12 and an encapsulation layer 13.

The flexible layer 11 is composed of any flexible insulating materials. For example, materials for the flexible base 11 can include one or more polymeric materials, such as polymide (PI), polycarbonate (PC), polyether sulfone (PES), polyethylene terephthalate (PET), polyethylene naphthalate (PEN), polyarylate (PAR) and fiber-reinforced plastic (FRP). The flexible base 11 can be transparent, translucent or opaque.

Figure 3:
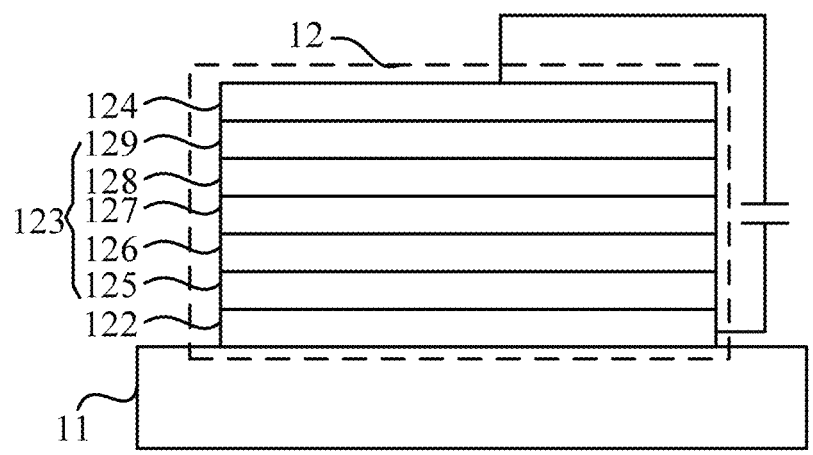
FIG. 3 shows a schematic diagram of OLED element according the present disclosure.

The OLED element 12 is disposed on the flexible base 11. In the present embodiment, the OLED element 12, preferably, is an OLED element that is formed on the TFT. Please also refer to FIG. 3. The OLED element 12 is disposed on the flexible base 11. Specifically, the OLED layer 12 includes a first electrode , an OLED layer 123 and a second electrode 124. The OLED layer 123 includes a plurality of stacked layers, from bottom to top: a hole injection layer (HIL) , a hole transport layer (HTL) 126, an emitting layer 127, an electronic transport layer (ETL) 128 and an electronic injection layer (EIL) 129.

The present embodiment does not impose limitations on the structure of TFTs. For example, a TFT can be but is not limited to a top gate type TFT. A TFT with another structure, such as a bottom gate type TFT, can also be disposed. For example, a semi-conductor active layer can change amorphous silicon (a-Si) into polysilicon (p-Si) through the crystallization of a-Si. In order to crystalize a-Si, methods such as rapid thermal annealing (RTA), solid phase crystallization (SPC), excimer laser annealing (ELA), metal-induced crystallization (MIC), metal-induced lateral crystallization (MILC) or sequential lateral solidification (SLS) can be adopted.

The encapsulation layer 13 is disposed on the OLED element 12. The encapsulation layer 13 can encapsulate the OLED element 14 so that the OLED element 12 is immune from external influences, thus deterioration of the OLED due to vapor and oxygen can be reduced.

In the present embodiment, the flexible base 11 and/or encapsulation layer 13 include one or more layers of patterned inorganic layer 14 and two or more layers of the organic layers 15. The two or more organic layers 15 are used to wrap the inorganic layer 14.

Specifically, the present embodiment takes the patterned inorganic layer 14 disposed in the flexible base 11 as an example. It should be understood that the example do not impose limitations on the position or number of the patterned inorganic layer 14 in the present disclosure. The patterned inorganic layer 14 and organic layers 15 of the present disclosure can also be disposed in the encapsulation layer 13, or be disposed in the flexible base 11 and encapsulation layer 13 concurrently.

Figure 2:
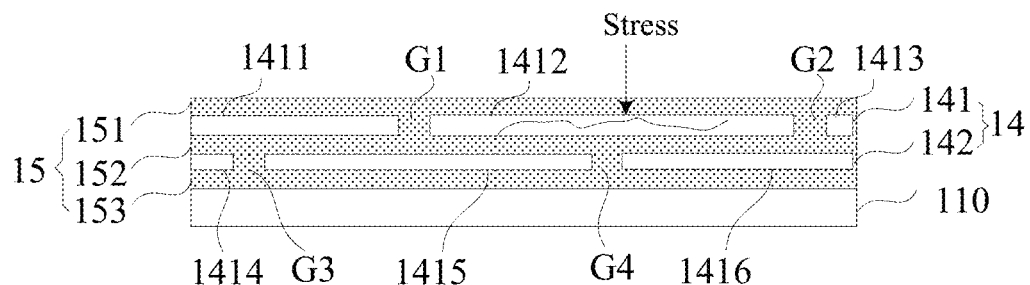
FIG. 2 shows a schematic diagram of an inorganic layer and organic layer according the present disclosure.

Please refer to FIG. 2. The flexible base 11 includes two patterned inorganic layers 141 and 142. Organic layers 15 are disposed above and below both the patterned inorganic layers 141 and 142. An organic layer 151 is disposed on one side of the inorganic layer 141 and an organic layer 152 is disposed on the other side of the inorganic layer 141, while the organic layer 152 is disposed on one side of the inorganic layer 142 and an organic layer 153 is disposed on the other side of the inorganic layer 142. The organic layer 151 provides a flat surface on the top side of a supporting base 110.

The patterned inorganic layer 14 includes a plurality of patterned areas. Gaps are formed among the plurality of patterned areas. The patterned inorganic layer 141 includes patterned areas 1411 to 1413. The patterned inorganic layer 142 includes patterned areas 1414 to 1416. A gap G1 is formed between the patterned areas 1411 and 1412, a gap G2 is formed between the patterned areas 1412 and 1413, a gap G3 is formed between the patterned areas 1414 and 1415, a gap G4 is formed between the patterned areas 1415 and 1416.

In the present embodiment, the organic layers 15 disposed above and below the patterned inorganic layers are connected through the abovementioned gaps. Take the patterned inorganic layer 141, and organic layers 151 and 152 as an example. The organic layer 151 connects the organic layer 152 through gaps G1 and G2. Therefore, the patterned areas 1411, 1412, and 1413 of the patterned inorganic layer 141 are wrapped individually by the organic layers 151 and 152, so that they are not connected to each other. When the stress focuses on a specific area of the inorganic layer, such as the patterned area 1412 shown in FIG. 2, and leading to fractures and peeling-offs, the organic layers 151 and 152 that wrap the patterned area 1412 can prevent fractures and peeling-offs to extend to a next area, such as the patterned areas 1411 and 1413 shown in FIG. . Therefore, it extends the life of the flexible display 10 being flexible and pliable.

The protection of the organic layers 152 and 153 offered to the patterned inorganic layer 142 is the same as that mentioned above. No further explanation is provided here.

Furthermore, positions of gaps of the patterned inorganic layer 14 are not aligned with that of gaps of a neighboring inorganic layer. Please refer to FIG. 2. The gaps G1 and G2 of the patterned inorganic layer 141 are not aligned with the gaps G 3and G4 of the patterned inorganic layer 142. Therefore, the design can effectively prevent the entry of vapor when the inorganic layers 14 are partially fractured or peeled off.

The abovementioned example is a flexible base 11 including patterned inorganic layers 14 and organic layers 15. The inorganic layers of the present embodiment are all patterned inorganic layers, such as the patterned inorganic layers 141 and 142 shown in FIG. 2. In other embodiments, the flexible base 11 can include, in addition to one or more patterned inorganic layers, flat and connected organic layers. For example, the flexible base 11 includes a patterned inorganic layer and a connected inorganic layer.

Other embodiments may have an encapsulation layer 13 including patterned inorganic layers 14 and organic layers 15, or a flexible base 11 and an encapsulation layer 13 that both include patterned inorganic layers 14 and organic layers 15. And, the number of layers of patterned inorganic layers 14 and organic layer 15 can be other numbers.

In the present embodiment, materials for the organic layers 15 include PET, PI, PC, epoxy, polyethylene, and/or polyacrylate, formed in single or stacked layers. Materials for the patterned inorganic layers 14 include metal oxides or metal nitrides, such as silica, silicon nitride, silicon oxynitride, alumina, aluminum nitride, or titanium oxide, shaped in single or stacked layers. The patterned inorganic layer 14 can prevent vapor, oxygen or impurity from extending to the OLED element 12 through the flexible base 11 and/or the encapsulation layer 13 to a satisfying extent.

Following the same line, a flexible display 10 of the present embodiment includes a patterned inorganic layer 14 composed of a single or plurality of layers. The organic layers 15 are connected through gaps in the patterned inorganic layers, so to wrap the inorganic layers. When the stress focuses on a specific area on the inorganic layer, leading to fractures and peeling-offs, the organic layers that wrapped the inorganic layers prevent the fractures and peeling-offs from expanding to a next area, and therefore extend the life of the flexible display being flexible and pliable.

Figure 4:
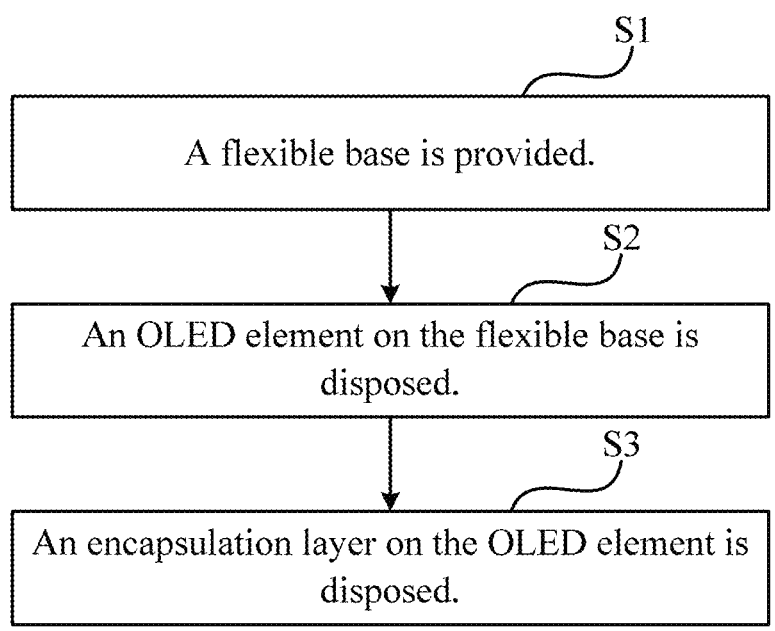
FIG. 4 is a flow chart on the production method of the flexible display.
Figure 5:
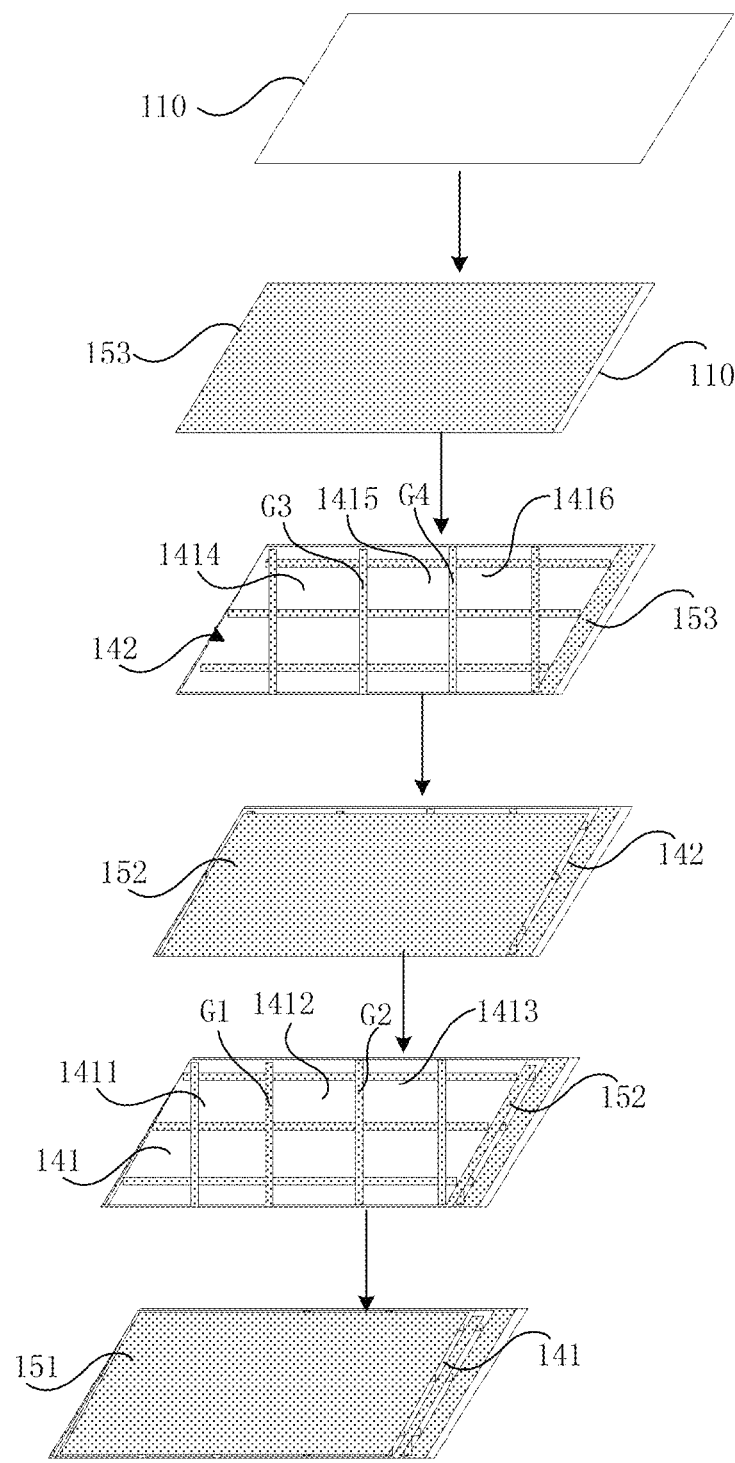
FIG. 5 is a flow chart on the production of the inorganic and organic layers.

The embodiment of the present disclosure further provides a method of forming the flexible display to be applied to the production of the abovementioned display. For more specific details, please refer to FIG. 4 and FIG. 5. FIG. 4 is a flow chart on the production method of the flexible display. FIG. 5 is a flow chart on the production of the inorganic and organic layers. The method of forming the flexible display of the present embodiment includes following steps:

Step S1: a flexible base is provided.

Step S2: an OLED element on the flexible base is disposed.

Step S3: an encapsulation layer on the OLED element is disposed.

The flexible base and/or the encapsulation layer include one or more patterned inorganic layers and two or more organic layers, which are used to wrap the inorganic layers.

The present embodiment provides detailed explanation with an example composed of a flexible base including one or more patterned inorganic layers and two or more organic layers. Please refer to FIG. 5 for a specific illustration of the production procedure of inorganic layers and organic layers.

First, a supporting base 110 is provided. The supporting base 110 is fixed and extended for the convenience of a production procedure afterwards.

Furthermore, an organic layer 153 is formed on the supporting layer 110.

Furthermore, an inorganic layer 142 is formed on the organic layer 153. The inorganic layer 142 is further patterned by different areas, so that it includes a plurality of patterned areas, such as patterned areas 1414-1416 in FIG. 5, forming a patterned inorganic layer. Gaps, such as G3 and G4 in FIG. 5, are formed among the plurality of patterned areas. These gaps expose the organic layer 153. Shape of the pattern can be rectangles, as shown in FIG. 5, or rounds or pentagons. The present embodiment does not impose limitations on the shape of the pattern.

Furthermore, an organic layer 152 is formed on the inorganic layer 142. The organic layers 152 and 153 are disposed below and above the inorganic layer 142 respectively. The organic layer 152 is connected to the organic layer 153 through gaps in the inorganic layer 142. At this point, the inorganic layer 142 is wrapped by the organic layers 153 and 152.

Furthermore, an inorganic layer 141 is formed on the organic layer 152. The inorganic layer 141 is further patterned by different areas, so that it includes a plurality of patterned areas, such as patterned areas 1411-1413 in FIG. 5, forming a patterned inorganic layer. Gaps, such as G1 and G2 in FIG. 5, are formed among the plurality of patterned areas. These gaps expose the organic layer 152. Positions of the gaps in the inorganic layers 142 and 141 are not aligned.

Furthermore, an organic layer 151 is formed on the inorganic layer 141. The organic layer 151 connects the organic layer 152 through gaps in the inorganic layer 141. At this point, the inorganic layer 141 is wrapped by the organic layers 151 and 152.

A structure of inorganic layers and organic layers of a flexible base can be formed through the abovementioned method.

The illustration above takes an example composed of a flexible base including one or more patterned inorganic layers and two or more organic layers to explain the production procedure in detail. If the encapsulation layer includes one or more patterned inorganic layers and two or more organic layers, the flexible base and OLED element are formed sequentially by following steps S1 and S2. Then, an organic layer 153 is formed on the OLED element, and the inorganic layer 142, organic layer 152, inorganic layer 141 and organic layer 151 are formed sequentially following the abovementioned forming method.

The organic layers are not limited to the abovementioned three-layer structure, whereas the inorganic layers are not limited to the abovementioned two-layer structure. An entire surface of inorganic layer can be added to the foundation of inorganic layers including patterned areas.

To sum up, the flexible display 10 of the present embodiment includes a single layer or plurality layers of patterned inorganic layer 14. The organic layers 15 are connected through the gaps in the patterned inorganic layers so to wrap the inorganic layers. When the stress focuses on a specific area of the inorganic layer and leads to fractures and peeling-offs, the organic layers that wrapped the inorganic layers prevent the next area on the inorganic layer from fracturing and peeling off as well. Therefore, it extends the life of the flexible display being flexible and pliable.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A flexible display, comprising:
a flexible base;
an organic light-emitting diode (OLED) element, disposing on the flexible base;
an encapsulation layer, disposed on the OLED element, with the flexible base and/or the encapsulation layer comprising one or more patterned inorganic layers and two or more organic layers, the two or more organic layers are configured to wrap the inorganic layers,
wherein the flexible base and the encapsulation layer comprise a plurality of patterned inorganic layers,
wherein the inorganic layers comprise a plurality of patterned areas, with gaps formed between the plurality of patterned areas; the two or more organic layers are disposed above and below the patterned inorganic layers, and are connected through the gaps.

2. The flexible display of claim 1, wherein positions of gaps in the inorganic layers are not aligned with that in neighboring inorganic layers.

3. The flexible display of claim 1, wherein the organic layers are made of polyethylene terephthalate (PET), polymide (PI), polycarbonate (PC), epoxy, polyethylene, and /or polyacrylate, formed in single or stacked layers.

4. The flexible display of claim 1, wherein the inorganic layers are made of silica, silicon nitride, silicon oxynitride, aluminum oxide, aluminum nitride, or titanium oxide.

* * * * *